United States Patent
Kang

(10) Patent No.: US 6,841,807 B2
(45) Date of Patent: Jan. 11, 2005

(54) PIN PHOTODIODE

(75) Inventor: Hwa-Young Kang, Suwon-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/621,587

(22) Filed: Jul. 17, 2003

(65) Prior Publication Data

US 2004/0108516 A1 Jun. 10, 2004

(30) Foreign Application Priority Data

Dec. 5, 2002 (KR) ................................ 10-2002-0076967

(51) Int. Cl.[7] .................. H01L 31/109; H01L 31/0328; H01L 21/00
(52) U.S. Cl. ......................... 257/184; 257/186; 438/78
(58) Field of Search ............................... 257/184, 186, 257/233; 438/78, 57

(56) References Cited

U.S. PATENT DOCUMENTS 6,458,620 B1 * 10/2002 Matsuda ...................... 438/78
6,525,347 B2 * 2/2003 Matsuda ..................... 257/184

* cited by examiner

*Primary Examiner*—Michael Trinh
*Assistant Examiner*—Kiesha Rose
(74) *Attorney, Agent, or Firm*—Cha & Reiter, L.L.C.

(57) ABSTRACT

Disclosed is a PIN photodiode used for a light-receiving element for optical communication. The PIN photodiode comprises a gate electrode structure consisting of a gate insulation layer and a gate electrode pad which prevent a bonding layer from being excessively depleted in the lateral direction at the time of applying a negative electric voltage to an electrode that is in contact with the bonding layer. The PIN photodiode allows the control of the electrostatic capacitance of the element by controlling the depletion level of the bonding layer in the lateral direction using the gate electrode pad. Therefore, it is possible to suppress the increase of the electrostatic capacitance and to achieve a high-speed operating property.

8 Claims, 2 Drawing Sheets

PIN PHOTODIODE

CLAIM OF PRIORITY

This application claims priority to an application entitled "PIN Photodiode," filed with the Korean Intellectual Property Office on Dec. 5, 2002 and assigned Serial No. 2002-76967, the contents of which are hereby incorporated by reference.

BACKGROUND OF THE INVENTION

1. Field of the Invention

The present invention relates to a PIN photodiode used for the reception of light signals in an optical communication field.

2. Description of the Related Art

In general, a PIN photodiode comprises a P-type semiconductor, a N-type semiconductor, and an intrinsic semiconductor layer interposed there-between. The PIN photodiode is typically used as a light-receiving element for converting an optical signal into an electric signal as it possessesexcellent characteristics in converting incident photons into electrons, mainly due to its ability to increase the width of a depletion layer of the PIN photodiode.

FIG. 1a is a top plan view of a conventional PIN photodiode, and FIG. 1b is a cross-sectional view taken along the line A-B of the PIN photodiode shown in FIG. 1a.

Referring to FIGS. 1a and 1b, the conventional PIN photodiode comprises: a non-doped InGaAs layer 2, a P− InP layer 3, a donut-shaped SiN insulation layer 4 with a circular window formed in the center of the insulation layer, a P+ bonding layer 5 formed on the InP layer 2 within the circular window, an electrode pad 6 formed on the SiN insulation layer 4 in contact with a part of the P+ bonding layer 5, and an anti-reflection layer 7 formed on the P+ bonding layer 5 in which the electrode pad 6 is not in contact, wherein the above layers and the electrode pad are formed on a N+ InP substrate in this order. The PIN photodiode operates when a negative electric field is applied to the P+ bonding layer 5 so that the P+ bonding layer 5 is sufficiently depleted.

In the above PIN diode, if a negative electric field is applied to the P+ bonding layer through the electrode pad, the bonding is laterally extended as compared to the case in which no electric field is applied, so that the area of the P+ bonding layer increases, thus causing a parasitic effect that increases the electrostatic capacitance of the element. However, as the electrostatic capacitance increases the RC time constant also increases, thereby deteriorating the high-speed operating property of the diode element.

Therefore, there is a need for an improved PIN photodiode that overcomes the above-described problem.

SUMMARY OF THE INVENTION

The present invention provides a PIN photodiode, which has an improved property as a high-speed light-receiving element through a control of the lateral depletion level of a bonding layer, thus suppressing an increase in the electrostatic capacitance in the photodiode.

One embedment of the present invention provides a PIN photodiode, which includes: a first conductive-type semiconductor substrate; an intrinsic semiconductor layer and a second conductive-type semiconductor layer, which are formed on the first conductive-type semiconductor substrate in this order; a first insulation layer formed on the second conductive-type semiconductor layer, in which a window is formed in the center part of the first insulation layer so that the intrinsic semiconductor layer is exposed; a second-conductive type active layer formed on the intrinsic semiconductor layer within the window; a first electrode formed on the first insulation layer to be in contact with the second conductive-type active layer; and, a gate electrode structure consisting of a second insulation layer and a second electrode formed on the second conductive-type semiconductor layer and applying an electric voltage of a second polarity, thus controlling the lateral extension of the active layer when an electric voltage of a first polarity is applied to the first electrode formed on the first insulation layer.

Preferably, the PIN photodiode further comprises an anti-reflection layer formed on the active layer within the window.

Preferably, the first insulation layer is formed to such a thickness that the first electrode and the second electrode are electrically isolated from each other without being overlapped between the crossed portions of the first electrode and the second electrode.

Preferably, the second insulation layer is formed to such a thickness that it can effectively transfer the electric field applied to the second electrode to the active layer.

More preferably, the second conductive-type active layer is a P+ active layer, the electric voltage of the first polarity is negative voltage, and the electric voltage of the second polarity is positive voltage.

BRIEF DESCRIPTION OF THE DRAWINGS

The above features and advantages of the present invention will become more apparent from the following detailed description taken in conjunction with the accompanying drawings, in which.

DETAILED DESCRIPTION OF THE PREFERRED EMBODIMENT

Hereinafter, preferred embodiments of the present invention will be described with reference to the accompanying drawings. For the purposes of clarity and simplicity, a detailed description of known functions and configurations incorporated herein will be omitted as it may make the subject matter of the present invention unclear.

Figure 1A:
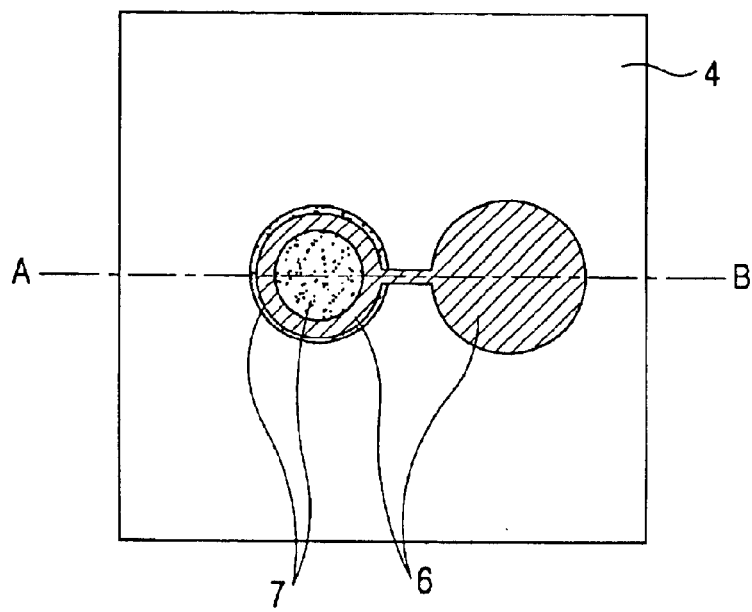
FIG. 1a is a top plan view of a PIN photodiode of the prior art.
Figure 1B:
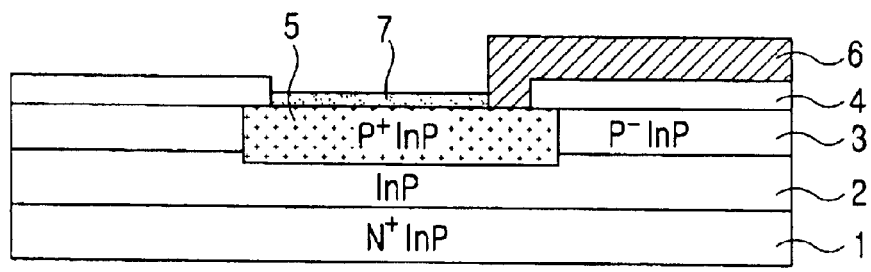
FIG. 1b is a cross-section view taken along the line A'–B'.
Figure 2A:
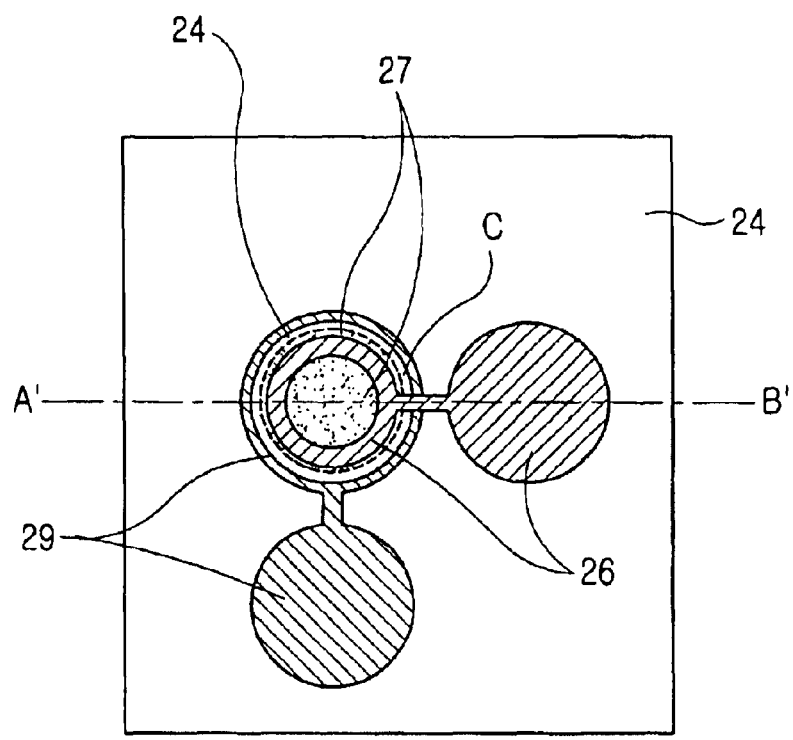
FIG. 2a is a top plan view of a PIN photodiode in accordance with a preferred embodiment of the present invention; and, FIG. 2b is a cross-section view taken along the line A'–B'.
Figure 2B:
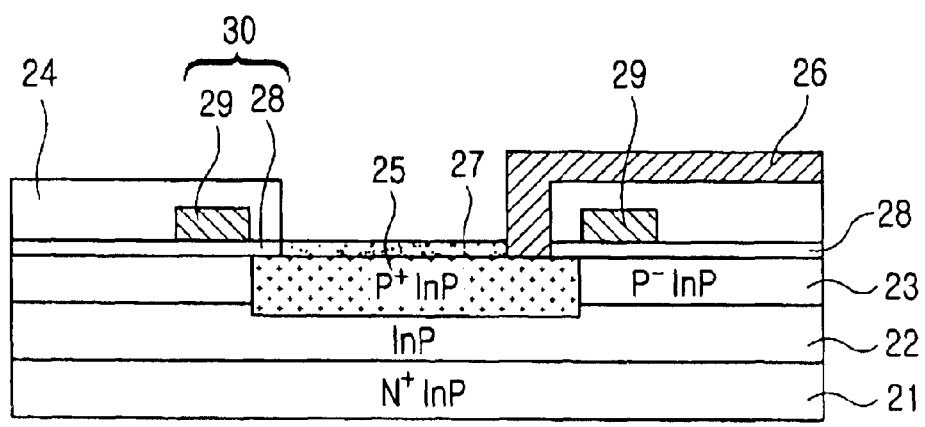

FIG. 2a is a top plan view of a PIN photodiode in accordance with an embodiment of the present invention, and FIG. 2b is a cross-sectional view taken along the line A'–B' of FIG. 2a.

As shown in FIGS. 2a and 2b, the PIN photodiode in accordance with the present embodiment includes: an InP layer 22, which is a non-doped intrinsic semiconductor layer, a P− InP layer 23, a donut-shaped SiN insulation layer 24 with a circular window formed in the center part thereof, a P+ bonding layer 25 formed on the InP layer 22 within the circular window, an electrode pad 26 formed on the P+ bonding layer 25, and a SiN anti-reflection layer 27 formed on the P+ InP layer 25. Note that these above layers and the electrode pad are? being formed on a N+ InP substrate 21 in the above order. The PIN photodiode further comprises a gate electrode structure consisting of a gate insulation layer 28 formed on the P⁻ InP layer 23 and a gate electrode pad 29 formed on the gate insulation layer 28.

The gate insulation layer 28 is operative to effectively transfer a positive electric field applied to the gate electrode pad 29 into the P⁺ bonding layer 25 and its formation is possible through a deposition process of SiN, SiO₂, etc.

The gate electrode pad 29 is caused to apply a positive electric field to the electrode pad 26 when a negative electric has been applied to the electrode pad 26 in contact with the P⁺ bonding layer 25, so that the P⁺ bonding layer 25 can be prevented from being laterally depleted. Thus, the lateral depletion level can be controlled in accordance with the amount of the current applied to the gate electrode pad 29.

As described above, the gate electrode structure 30, consisting of the gate insulation layer 28 and the gate electrode pad 29, is similar to the gate of a MOS transistor in function and construction. The MOS transistor is an element which comprises a metallic gate electrode attached to a semiconductor through an insulation film and which controls the current flowing between a source and a drain in accordance with an electric voltage applied to the gate electrode.

The SiN insulation layer 24 is interposed between the crossed portions C of the electrode pad 26 and the gate electrode pad 29, so that the electrode pad 26 and the gate electrode pad 29 are electrically isolated without being overlapped. Therefore, the SiN insulation 24 must be formed at least to a thickness that is thicker than that of the gate electrode pad 29 and capable of executing electric isolation between the electrode pad 26 and the gate electrode pad 29.

As described above, the PIN photodiode in accordance with the present invention allows the control of the electrostatic capacitance of the element by controlling the depletion level of the bonding layer in the lateral direction using the gate electrode pad. Therefore, it is possible to suppress the increase of the electrostatic capacitance and to achieve a high-speed operating property of the element.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A PIN photodiode comprising:
   a first conductive-type semiconductor substrate;
   an intrinsic semiconductor layer and a second conductive-type semiconductor layer formed on the first conductive-type semiconductor substrate in sequence;
   a first insulation layer formed on the second conductive-type semiconductor layer, in which a window is formed in the center part of the first insulation layer so that the intrinsic semiconductor layer is exposed;
   a second-conductive type active layer formed on the intrinsic semiconductor layer within the window;
   a first electrode formed on the first insulation layer in contact with the second conductive-type active layer; and,
   a gate electrode structure consisting of a second insulation layer and a second electrode formed on the second conductive-type semiconductor layer and for applying an electric voltage of a second polarity, so that the lateral extension of the active layer is controlled at the time when an electric voltage of a first polarity is applied to the first electrode formed on the first insulation layer.

2. The PIN photodiode according to claim 1, further comprising an anti-reflection layer formed on the active layer within the window.

3. The PIN photodiode according to claim 1, wherein the first insulation layer is formed to such a thickness that the first electrode and the second electrode are electrically isolated from each other without being overlapped between the crossed portions of the first electrode and the second electrode.

4. The PIN photodiode according to claim 1, wherein the second insulation layer is formed to such a thickness that it can effectively transfer the electric field applied to the second electrode to the active layer.

5. The PIN photodiode according to claim 1, wherein the second conductive-type active layer is a P+ active layer.

6. The PIN photodiode according to claim 1, wherein the electric voltage of the first polarity is negative voltage.

7. The PIN photodiode according to claim 1, wherein the electric voltage of the second polarity is positive voltage.

8. The PIN photodiode according to claim 1, wherein the thickness of the first insulation is substantially greater than the second electrode.

* * * * *